United States Patent
Pei

(10) Patent No.: US 8,444,767 B2
(45) Date of Patent: May 21, 2013

(54) COATING DEVICE

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 294 days.

(21) Appl. No.: 12/981,552

(22) Filed: Dec. 30, 2010

(65) Prior Publication Data

US 2012/0073499 A1   Mar. 29, 2012

(30) Foreign Application Priority Data

Sep. 29, 2010   (TW) ................ 99132950 A

(51) Int. Cl.
*C23C 16/00* (2006.01)
*C23C 16/50* (2006.01)
*B05C 11/00* (2006.01)

(52) U.S. Cl.
USPC .............. 118/719; 118/723 EB; 118/723 VE; 118/690; 118/708; 118/730

(58) Field of Classification Search
USPC .................. 118/719, 723 EB, 723 VE, 690, 118/708, 730
See application file for complete search history.

(56) References Cited

U.S. PATENT DOCUMENTS

| 2003/0153180 | A1* | 8/2003 | Marunaka et al. | ...... 118/723 VE |
| 2004/0094092 | A1* | 5/2004 | Derderian et al. | ............ 118/715 |
| 2004/0173160 | A1* | 9/2004 | Misiano et al. | ......... 118/723 EB |
| 2010/0261340 | A1* | 10/2010 | Nijhawan et al. | ..... 257/E21.108 |

* cited by examiner

*Primary Examiner* — Dah-Wei Yuan
*Assistant Examiner* — Binu Thomas
(74) *Attorney, Agent, or Firm* — Altis Law Group, Inc.

(57) ABSTRACT

A coating device includes a reaction device, a mixing device, a deposition device, a first switching device and a second switching device. The reaction device defines a reaction chamber. The mixing device is connected to the reaction device and defines a mixing chamber that communicates with the reaction chamber. The deposition device is connected to the mixing device and defines a deposition chamber that communicates with the mixing chamber. The first switching device is configured to communicate the reaction chamber and the mixing chamber and separate the reaction chamber from the mixing chamber. The second switching device is configured to communicate the mixing chamber and the deposition chamber and separate the mixing chamber from the deposition chamber.

12 Claims, 1 Drawing Sheet

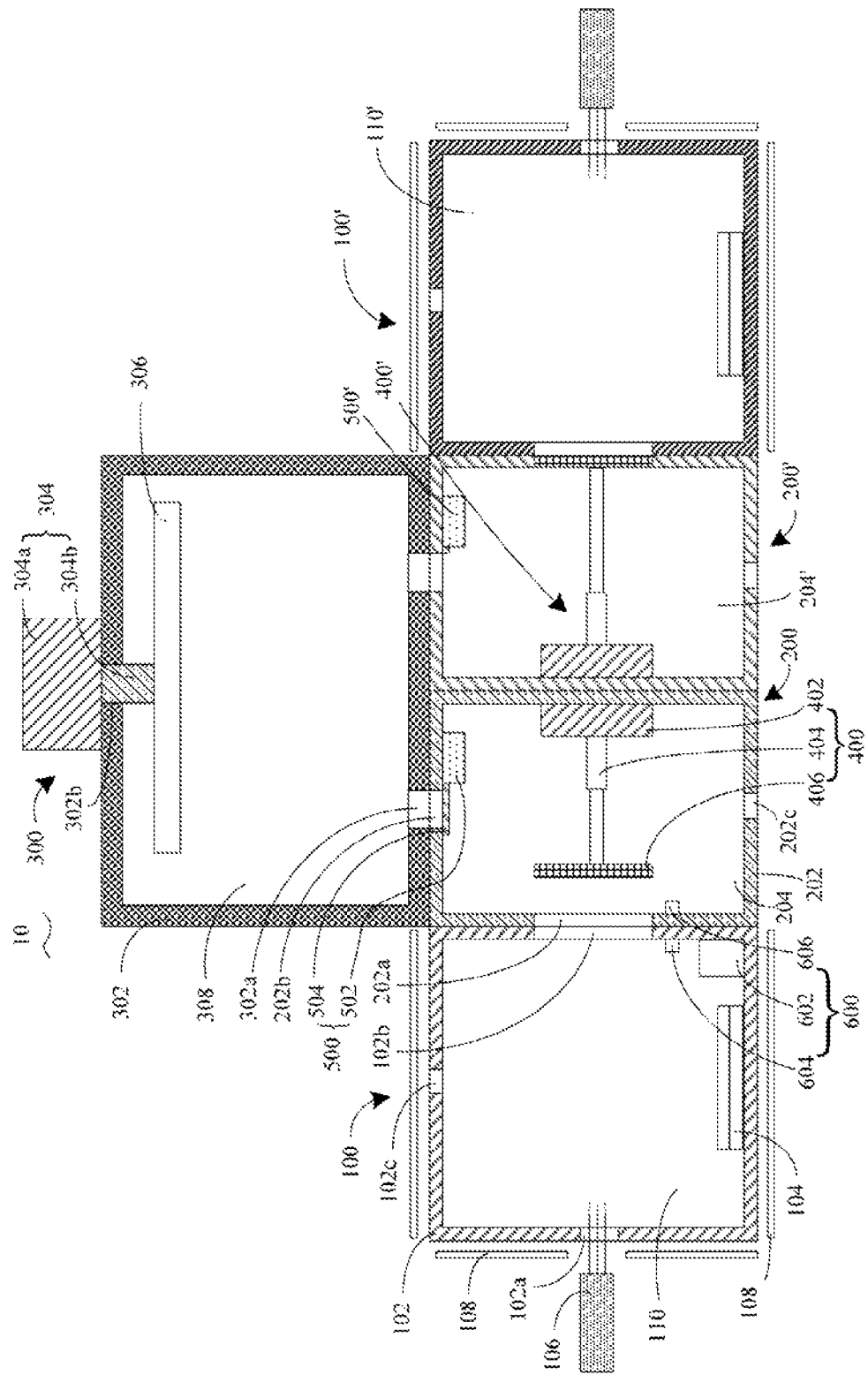

COATING DEVICE

BACKGROUND

1. Technical Field

The disclosure relates to coating technology and, particularly, to a coating device.

2. Description of Related Art

Traditional chemical vapor deposition (CVD) usually includes a main body that defines a coating chamber, a bracket housed in the chamber for seating workpieces, a crucible received in the chamber for holding a precursor, an electron gun for generating electron beams to bombard the precursor, and a gas source for providing working gas into the chamber. In operation, bombarded by the electron beam, the precursor emits molecules thereof. The molecules react with the working gas to form a compound gas while moving towards the workpieces. The compound gas deposits on the surface of the workpiece, forming a desired film. Because the reaction of the molecules and the working gas and the deposition of the compound gas take place in the same chamber, it is unavoidable for residual partially-reacted molecules to deposit on the surface of the workpiece, which degrades the quality of the film.

Therefore, it is desirable to provide a coating device which can overcome the described limitations.

BRIEF DESCRIPTION OF THE DRAWING

Many aspects of the present disclosure should be better understood with reference to the following drawing. The components in the drawing are not necessarily drawn to scale, the emphasis instead being placed upon clearly illustrating the principles of the present disclosure.

The FIGURE is a schematic view of a coating device, in accordance with an embodiment.

DETAILED DESCRIPTION

Embodiments of the present disclosure will now be described in detail with reference to the drawing.

Referring to the FIGURE, a coating device 10, according to an embodiment, includes a first reaction device 100, a first mixing device 200, a first deposition device 300, a first switching device 400, and a second switching device 500.

The first reaction device 100 defines a first reaction chamber 110. In detail, the first reaction device 100 includes a first case 102 that defines the first reaction chamber 110, a crucible 104 for holding a precursor (not shown), an electron gun 106 for generating electron beams, and a heating unit 108. The first case 102 defines an injection port 102a, a first outlet 102b, and a first air hole 102c therethrough, all of which communicate the first reaction chamber 110 with outside. The first air hole 102c is connected to a working air source (not shown). The electron gun 106 is arranged outside the first reaction chamber 110 and used for generating electron beams. The electron beams enter the first reaction chamber 110 via the injection port 102a. The crucible 104 is fixed in the first reaction chamber 110 and includes magnetic material therein to attract the electron beams, thereby the precursor held therein is efficiently bombarded. The heating unit 108 surrounds the first case 102 applying heat thereto.

The first mixing device 200 is connected to the first reaction device 100 and defines a first mixing chamber 204 that communicates with the first reaction chamber 110. In detail, the first mixing device 200 includes a second case 202 that defines the first mixing chamber 204. The second case 202 defines a first inlet 202a, a second outlet 202b, and a second air hole 202c that is connected to a carrier gas source (not shown) therethrough. The first inlet 202a is connected to the first outlet 102b, thereby the first mixing chamber 204 communicates with the first reaction chamber 110 via the first inlet 202a and the first outlet 102b.

The first deposition device 300 is connected to the first mixing device 200 and defines a first deposition chamber 308 that communicates with the first mixing chamber 204. In detail, the first deposition device 300 includes a third case 302 that defines the first deposition chamber 308, a driving device 304, and a bracket 306. The third case 302 defines a second inlet 302a and a shaft hole 302b therethrough. The second inlet 302a is connected to the second outlet 202b, such that the first deposition chamber 308 communicates with the first mixing chamber 204 via the second inlet 302a and the second outlet 202b. The driving device 304 includes a motor 304a and a rotating shaft 304b rotated by the motor 304a. The motor 304a is arranged outside the first deposition device 300 with the rotating shaft 304b extending into the first deposition chamber 308 via the shaft hole 302b. The bracket 306 is used for seating workpieces (not shown) and is connected to the rotating shaft 304b, so as to be rotated about the rotating shaft 304b.

The first switching device 400 is used to communicate and separate the first reaction chamber 110 and the first mixing chamber 204. In detail, the first switching device 400 includes a first cylinder 402 fixed on an inner surface of the second case 202 that faces the first inlet 202a, a piston rod 404 extending out from the cylinder 402, and a first plate 406 connected to the piston rod 404. The first cylinder 402 is configured to move the first plate 406 to move between a first position and a second position through the piston rod 404. At the first position, the first plate 406 hermetically seals the first inlet 202a, isolating the first reaction chamber 110 from the first mixing chamber 204. At the second position, the first plate 406 is removed from the first inlet 202a, thereby the first reaction chamber 110 communicating with the first mixing chamber 204.

It should be understood that, the first switching device 400 is not limited to the present disclosure, as long as it is capable of communicating and separating the first reaction chamber 110 and the first mixing chamber 204. In alternative embodiments, the first switching device 400 can be received in the first reaction chamber 110 and configured to communicate and separate the first reaction chamber 110 and the first mixing chamber 204.

The second switching device 500 is used to communicate and isolate the first mixing chamber 204 and the first deposition chamber 308. In detail, the second switching device 500 includes a second cylinder 502 fixed on an inner surface of the second case 202 that defines the second outlet 202b and a second plate 504 driven by the second cylinder 502. The second cylinder 502 is configured to move the second plate 504 from a third position to a fourth position. At the third position, the second plate 504 hermetically seals the second outlet 202b, isolating the first mixing chamber 204 and the first deposition chamber 308. At the fourth position, the second plate 504 is removed from the second outlet 202b, thereby the first mixing chamber 204 communicating with the first deposition chamber 308.

It should be understood that the second switching device 500 is not limited to the present disclosure, as long as it is capable of communicating and separating the first mixing chamber 204 and the first deposition chamber 308. In alternative embodiments, the second switching device 500 can be received in the first deposition chamber 308 and configured for communicate the first mixing chamber 204 and the first deposition chamber 308 and isolating the first mixing chamber 204 from the first deposition chamber 308.

In operation, workpieces are fixed to the bracket 306, the precursor is put into the crucible 104, the heating unit 108 heats the first case 102, the electron gun 106 injects electron beams into the first reaction chamber 110, the working gas is introduced into the first reaction chamber 110, and the first cylinder 402 drives the first plate 406 to the first position to hermetically seal the first inlet 202a and separate the first reaction chamber 110 from the first mixing chamber 204. Bombarded by the electron beams, the precursor emits molecules thereof. The molecules and the working gas sufficiently react with each other and transform into a compound gas in a predetermined reaction time. Under the heat of the heating unit 108, the reaction of the precursor and the working gas is accelerated. In the present embodiment, the precursor is trititanium pentoxide ($Ti_3O_5$), the working gas is oxygen ($O_2$), and the compound gas is titanium dioxide ($TiO_2$).

After the predetermined reaction time, the second cylinder 502 drives the second plate 504 to the third position and hermetically seal the second outlet 202b to isolate the first mixing chamber 204 from the first deposition chamber 308. The first cylinder 402 drives the first plate 406 to the second position to communicate the first reaction chamber 110 and the first mixing chamber 204. After a predetermined waiting time, the compound gas flows into the first mixing chamber 204. The first switching device 400 separates the first reaction chamber 110 and the first mixing chamber 204, the carrier gas is then introduced into the first mixing chamber 204 via the second gas hole 202c and mixes with the compound gas, thereby a mixture gas of the compound gas and the carrier gas with a desired concentration of the compound gas is generated in the first mixing chamber 204. In the present embodiment, the carrier gas is nitrogen ($N_2$).

After the mixture gas is generated, the second switching device 500 drives the second plate to the fourth position to communicate the first mixing chamber 204 with the first deposition chamber 308. The driving device 304 rotates the bracket 306. Thus, the mixture gas flows into the first deposition chamber 308 and deposits onto the surface of each workpiece, forming a desired film. In the present embodiment, the desired film is made of titanium dioxide ($TiO_2$).

As the first reaction chamber 110 is hermetically sealed, the reaction time of the precursor and the working air can be controlled; as the mixture gas of the compound gas and the carrier gas is generated in the hermetical first mixing chamber 204, the concentration of the compound gas can be precisely controlled, which ensures that the precursor and the working gas are efficiently transformed into the compound gas and, thus, the quality of the film is guaranteed and even improved.

In alternative embodiments, the coating device can further include a controlling device 600. The controlling device 600 includes a first sensor 604 received in the first reaction chamber 110, a second sensor 606 received in the first mixing chamber 204, and a controller 602 connected to the first sensor 604, the second sensor 606, the driving device 304, the first switching device 400 and the second switching device 500. The first sensor 604 is configured for generating a first signal when determining that the gas concentration in the first reaction chamber 110 reaches a first predetermining gas concentration at which the molecules and the working gas react with each other and sufficiently transform into the compound gas. The second sensor 606 is configured for generating a second signal when determining that the gas concentration in the first mixing chamber 204 reaches a second predetermining gas concentration at which the mixture gas of the compound gas and the carrier gas with a desired concentration of the compound gas has been generated. The controller 602 is configured for controlling the first switching device 400 to communicate the first reaction chamber 110 with the first mixing chamber 204 when receiving the first signal, and controlling the second switching device 500 to communicate the first mixing chamber 204 with the first deposition chamber 308 and controlling the driving device 304 to rotate the bracket 306 when receiving the second signal.

In alternative embodiments, the coating device 10 can further include a second reaction device 100', a second mixing device 200', a third switching device 400', and a fourth switching device 500'. The second reaction device 100' defines a second reaction chamber 110'. The second mixing device 200' is connected to the second reaction device 100' and the first deposition device 300 and defines a second mixing chamber 204' that communicates with the second reaction chamber 110' and the first deposition chamber 308. The third switching device 400' is used to communicate and separate the second reaction chamber 110' and the second mixing chamber 204'. The fourth switching device 500' is used to communicate and separate the second mixing chamber 204' and the first deposition chamber 308. In the illustrated embodiment, the first reaction device 100 is positioned on the left side of the first mixing device 200. The first deposition device 300 is positioned on the top of the first mixing device 200. The second reaction device 100' is positioned on the right side of the second mixing device 200'. The first deposition device 300 is positioned on the top of the second mixing device 200'.

It will be understood that the above particular embodiments is shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A coating device, comprising:
   a first reaction device that defines a first reaction chamber;
   a first mixing device connected to the first reaction device and defining a first mixing chamber that communicates with the first reaction chamber, the first mixing device comprising a second case that defines the first mixing chamber, the second case defining a first inlet communicated with the first reaction chamber;
   a deposition device connected to the first mixing device and defining a deposition chamber that communicates with the first mixing chamber;
   a first switching device configured to communicate the first reaction chamber with the first mixing chamber and configured to separate the first reaction chamber from the first mixing chamber, the first switching device comprising a first cylinder fixed in the second case, a piston rod extending out from the first cylinder and a first plate connected to the piston rod, the first cylinder being configured to move the first plate to move between a first position where the first plate hermetically seals the first inlet and a second position where the first plate is located away from the first inlet; and
   a second switching device configured to communicate the first mixing chamber with the deposition chamber and configured to isolate the first mixing chamber from the deposition chamber.

2. The coating device of claim 1, wherein the first reaction device comprises a first case that defines the first reaction chamber, a crucible for holding a precursor, an electron gun, and a heating unit; the first case defines an injection port, a first outlet communicated with the first mixing chamber, and a first air hole for connecting to a working air source; the electron gun is arranged outside the first reaction chamber and configured to generate and inject electron beams into the first reaction chamber via the injection port; the crucible is fixed in the first reaction chamber and is comprised of magnet material; the heating unit surrounds the first case.

3. The coating device of claim 1, wherein the second case defines a second outlet communicated with the deposition chamber, and a second air hole for connecting to a carrier gas source.

4. The coating device of claim 1, wherein the first cylinder is fixed on an inner surface of the second case and faces the first inlet.

5. The coating device of claim 4, wherein the second switching device comprises a second cylinder fixed in the second case and a second plate connected to the second cylinder; the second cylinder is configured to drive the second plate to move between a third position where the second plate hermetically seals the second outlet, and a fourth position where the second plate is located away from the second outlet.

6. The coating device of claim 5, wherein the second cylinder is fixed on another inner surface of the second case in which the second outlet is defined.

7. The coating device of claim 1, wherein the deposition device comprises a third case that defines the deposition chamber and a bracket received in the deposition chamber for seating workpieces; the third case defines a second inlet communicated with the first mixing chamber.

8. The coating device of claim 7, wherein the deposition device further comprises a driving device, the driving device comprises a motor and a rotating shaft connected to the motor; the third case defines a shaft hole, the motor is arranged outside the deposition device with the rotating shaft inserting into the deposition chamber via the shaft hole; the bracket is connected to the rotating shaft to be driven to rotate about the rotating shaft.

9. The coating device of claim 1, wherein the coating device further comprises a controlling device that comprises a controller connected to the first switching device and the second switching device, the controller is configured to control the first switching device to communicate the first reaction chamber with the first mixing chamber and control the first switching device to separate the first reaction chamber from the first mixing chamber; the controller is configured to control the second switching device to communicate the first mixing chamber with the deposition chamber and control the second switching device to isolate the first mixing chamber from the deposition chamber.

10. The coating device of claim 9, wherein the controlling device further comprises a first sensor received in the first reaction chamber and a second sensor received in the first mixing chamber, the first sensor and the second sensor are connected to the controller; the first sensor is configured for generating a first signal when determining that the gas concentration in the first reaction chamber reaches a first predetermining gas concentration, the second sensor is configured for generating a second signal when determining that the gas concentration in the first mixing chamber reaches a second predetermining gas concentration, the controller is configured for controlling the first switching device to communicate the first reaction chamber with the first mixing chamber when receiving the first signal, controlling the second switching device to communicate the first mixing chamber with the deposition chamber when receiving the second signal.

11. The coating device of claim 1, wherein the coating device further comprises a second reaction device, a second mixing device, a third switching device, and a fourth switching device; the second reaction device defines a second reaction chamber, the second mixing device is connected to the second reaction device and the deposition device and defines a second mixing chamber, the second mixing chamber communicates with the second reaction chamber and the deposition chamber, the third switching device is configured to communicate the second reaction chamber with the second mixing chamber and configured to separate communicate the second reaction chamber from the second mixing chamber, the fourth switching device is configured to communicate the second mixing chamber with the deposition chamber and configured to separate the second mixing chamber from the deposition chamber.

12. The coating device of claim 11, wherein the first reaction device is positioned on a left side of the first mixing device, the deposition device is positioned on the top of the first mixing device, the second reaction device is positioned on a right side of the second mixing device, the deposition device is positioned on the top of the second mixing device.

* * * * *